(12) United States Patent
Mikhael et al.

(10) Patent No.: US 6,774,018 B2
(45) Date of Patent: *Aug. 10, 2004

(54) BARRIER COATINGS PRODUCED BY ATMOSPHERIC GLOW DISCHARGE

(75) Inventors: Michael G. Mikhael, Tucson, AZ (US); Angelo Yializis, Tucson, AZ (US); Richard E. Ellwanger, Tucson, AZ (US)

(73) Assignee: Sigma Laboratories of Arizona, Inc., Tucson, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/228,358

(22) Filed: Aug. 26, 2002

(65) Prior Publication Data

US 2002/0195950 A1 Dec. 26, 2002

Related U.S. Application Data

(63) Continuation-in-part of application No. 09/660,003, filed on Sep. 12, 2000, now Pat. No. 6,441,553, which is a continuation-in-part of application No. 09/241,882, filed on Feb. 1, 1999, now Pat. No. 6,118,218.

(51) Int. Cl.[7] .............................................. H01L 21/20
(52) U.S. Cl. ........................ 438/485; 438/480; 438/481; 438/482; 438/483; 438/484; 438/510; 438/710
(58) Field of Search ................................. 438/480–485, 438/513, 710

(56) References Cited

U.S. PATENT DOCUMENTS 5,508,368 A * 4/1996 Knapp et al. ................ 427/534
5,789,145 A * 8/1998 Glocker et al. ............. 430/527
6,441,553 B1 * 8/2002 Yializis et al. .......... 315/111.21

* cited by examiner

*Primary Examiner*—Long Pham
*Assistant Examiner*—Wai-Sing Louie
(74) *Attorney, Agent, or Firm*—Antonio R. Durando; Quarles & Brady Streich Lang LLP (57) ABSTRACT

A plasma is produced in a treatment space by diffusing a plasma gas at atmospheric pressure and subjecting it to an electric field created by two metallic electrodes separated by a dielectric material, a vapor precursor is mixed with the plasma, and a substrate material is coated by vapor deposition of the vaporized substance at atmospheric pressure in the plasma field. The use of vaporized silicon-based materials, fluorine-based materials, chlorine-based materials, and organo-metallic complex materials enables the manufacture of coated substrates with improved properties with regard to moisture-barrier, oxygen-barrier, hardness, scratch- and abrasion-resistance, chemical-resistance, low-friction, hydrophobic and/or oleophobic, hydrophilic, biocide and/or antibacterial, and electrostatic-dissipative/conductive characteristics.

16 Claims, 6 Drawing Sheets

BARRIER COATINGS PRODUCED BY ATMOSPHERIC GLOW DISCHARGE

RELATED APPLICATIONS

This application is a continuation-in-part of U.S. Ser. No. 09/660,003, filed on Sep. 12, 2000, now U.S. Pat. No. 6,441,553 which is a continuation-in-part of Ser. No. 09/241,882, filed on Feb. 1, 1999, issued as U.S. Pat. No. 6,118,218.

BACKGROUND OF THE INVENTION

1. Field of the Invention

This invention relates generally to barrier films; in particular, the invention relates to films and coatings with improved barrier characteristics produced by combining vapor deposition and steady-state glow-discharge plasma at atmospheric pressure and low temperatures.

2. Description of the Related Art

Glow-discharge plasma treatment is an effective method of treating surfaces to increase their wettability and adhesion to various materials. Glow discharge provides a uniform and homogenous plasma that produces a consistent surface treatment with high-energy electrons that collide with, dissociate and ionize low-temperature neutrals, thereby creating highly reactive free radicals and ions. These reactive species enable many chemical processes to occur with otherwise unreactive low-temperature feed stock and substrates. Based on these properties, low-density glow-discharge plasmas are usually utilized for low material-throughput processes involving surface modification.

These plasmas are typically formed by partially ionizing a gas at a pressure well below atmosphere. For the most part, these plasmas are weakly ionized, with an ionization fraction of $10^{-5}$ to $10^{-1}$, established with AC or DC power in systems with varied geometries. These systems require vacuum chambers and pumps to maintain a low pressure, which increases operating and maintenance costs. Accordingly, there has been an extensive effort to develop plasma systems capable of operating at atmospheric pressure for surface treatment of polymer films, foils, and paper.

It is known that atmospheric plasma can be generated at relatively low temperatures with a proper power source, the insertion of a dielectric layer between the electrodes, and the use of an appropriate gas mixture as plasma medium. For surface treatment of polymer films, fabrics, paper, etc., atmospheric plasma can be established between two electrodes using an inert gas such as helium under particular operating conditions. Usually one electrode is attached to a high voltage power supply, and a rotating drum is grounded and acts as the other electrode. One electrode is coated with a ceramic layer and the plasma gas is injected between electrodes. Examples of such glow-discharge plasma systems operating at atmospheric pressure are described in U.S. Pat. Nos. 5,387,842, 5,403,453, 5,414,324, 5,456,972, 5,558,843, 5,669,583, 5,714,308, 5,767,469, and 5,789,145.

U.S. Pat. No. 6,118,218, incorporated herein by reference, disclosed a plasma treatment system capable of producing a steady glow discharge at atmospheric pressure with a variety of gas mixtures operating at frequencies as low as 60 Hz. The invention consists of incorporating a porous metallic layer in one of the electrodes of a conventional plasma treatment system. A plasma gas is injected into the electrode at substantially atmospheric pressure and allowed to diffuse through the porous layer, thereby forming a uniform glow-discharge plasma. As in prior-art devices, the material to be treated is exposed to the plasma created between this electrode and a second electrode covered by a dielectric layer. Because of the micron size of the pores of the porous metal, each pore also produces a hollow cathode effect that facilitates the ionization of the plasma gas. As a result, a steady-state glow-discharge plasma is produced at atmospheric pressure and at power frequencies as low as 60 Hz. In order for the electrode holes to operate effectively for producing an optimal glow discharge, their size must approach the mean free path of the plasma gas at the system's operating pressure.

Copending U.S. Ser. No. 09/660,003, herein incorporated by reference, discloses a further improvement in the art as a result of the discovery that the porous metallic layer of U.S. Pat. No. 6,118,218 may be used in conjunction with novel electrode arrangements to overcome the substrate-thickness limitations imposed by conventional plasma-treatment apparatus. In an exemplary embodiment, the invention consists of two metallic electrodes embedded side by side in a dielectric medium having an outer layer defining an exposed treatment space. One of the electrodes is made of a porous metal and serves as a conduit for introducing the plasma gas into the treatment space at substantially atmospheric pressure. The two electrodes are energized in conventional manner, using one of the electrodes as a ground, to create an electric field between them and produce a uniform glow-discharge plasma in the treatment space. Thus, the material to be treated can be exposed to the plasma so created without substantial limitation as to thickness, geometry and composition. By eliminating the need to maintain an electric field across the substrate being treated, the electrode assembly of the invention makes it possible to treat thick substrates and substrates of metallic composition that could not be treated with prior-art equipment. In addition, a powdery substrate can be treated by adding a shaker to a belt used to convey the substrate through the plasma field.

According to another embodiment of the invention disclosed in Ser. No. 09/660,003, vapor deposition is carried out in combination with plasma treatment by vaporizing a substance of interest, mixing it with the plasma gas, and diffusing the mixture through the porous electrode. A heater is provided to maintain, if necessary, the temperature of the electrode above the condensation temperature of the substance in order to prevent deposition during diffusion. Thus, plasma treatment and vapor deposition are carried out on a target substrate at the same time at atmospheric pressure.

The present invention is a further refinement of the combination of vapor deposition and plasma treatment at atmospheric pressure using certain classes of evaporable liquid and solid materials to produce films and coatings with improved barrier properties. Inasmuch as similar coatings have been produced using vapor deposition and plasma treatment under vacuum, many useful gases (i.e., vapors at ambient conditions) and vaporizable constituents are known from the prior art that can also be used advantageously in the atmospheric-pressure process of the invention (such materials are typically referred to as "precursors" in the art).

BRIEF SUMMARY OF THE INVENTION

The primary objective of this invention is the manufacture of films with improved properties by combining plasma treatment and vapor deposition of judiciously selected gases or vaporizable materials (either liquid or solid) at atmospheric pressure.

In particular, the invention is directed at the atmospheric-pressure manufacture of films and sheets (coating layers, in general) with improved barrier properties to moisture and oxygen for use in packaging, displays and electronic applications.

Another goal is the atmospheric-pressure manufacture of materials with improved hardness and resistance to scratch and abrasion for protective-coating applications.

Another objective is the atmospheric-pressure production of coatings with improved chemical resistance for use as structural materials and for protective-coating applications.

Still another objective is the atmospheric-pressure manufacture of low-friction coatings for tools and machine parts.

Another goal is the atmospheric-pressure production of coatings with hydrophobic and/or oleophobic properties for use in filters, membranes, electrets, and textile applications.

Another object is the atmospheric-pressure production of coatings with hydrophilic properties for use in filters, membranes, and textile applications.

Another objective is the atmospheric-pressure production of coatings with biocidal and antibacterial properties for use in chemical and biological protective materials.

Yet another goal is the atmospheric-pressure manufacture of coatings with electrostatic-dissipative/conductive properties for use in electronic packaging applications.

Therefore, according to these and other objectives, the invention consists of producing a plasma in a treatment space by passing a plasma gas through a porous layer and subjecting it to an electric field produced by two metallic electrodes separated by a dielectric material, by mixing a vapor substance with the plasma, and by coating a substrate material by vapor deposition of the vaporized substance at atmospheric pressure in the plasma field. In one embodiment of the invention, the two electrodes are positioned side by side, separated by the dielectric material, and face the treatment space alongside both electrodes. In another embodiment, the two electrodes are positioned opposite to each other and face the treatment space and the dielectric material placed between them.

Depending on the specific surface properties desired for the coating applied to the substrate, various precursors (gaseous, liquid and/or solid substances) may be injected in vapor form into the plasma space for atmospheric-pressure deposition according to the invention. The use of silicon-based materials, fluorine-based materials, chlorine-based materials, and organo-metallic complex materials enable the manufacture of coated substrates with improved properties with regard to moisture-barrier, oxygen-barrier, hardness, scratch- and abrasion-resistance, chemical-resistance, low-friction, hydrophobic and/or oleophobic, hydrophilic, chemical-resistance, biocide/antibacterial, and electrostatic-dissipative/conductive characteristics. The materials in vapor form were processed successfully in the deposition chamber at atmospheric pressure both by mixing and injecting them with the plasma gas (helium) stream and by injecting them separately (via a nozzle) in the vicinity of the plasma gas.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose only some of the various ways in which the invention may be practiced.

DESCRIPTION OF THE PREFERRED EMBODIMENTS OF THE INVENTION

This invention utilizes the advantages produced by the plasma-treatment electrodes disclosed in U.S. Ser. No. 09/660,003 and U.S. Pat. No. 6,118,218 to improve the surface properties of coated substrates manufactured by plasma-enhanced vapor deposition at atmospheric pressure. Accordingly, the invention may be carried out using the various embodiments of the apparatus described in those disclosures, which are herein incorporated by reference in their entirety.

Figure 1:
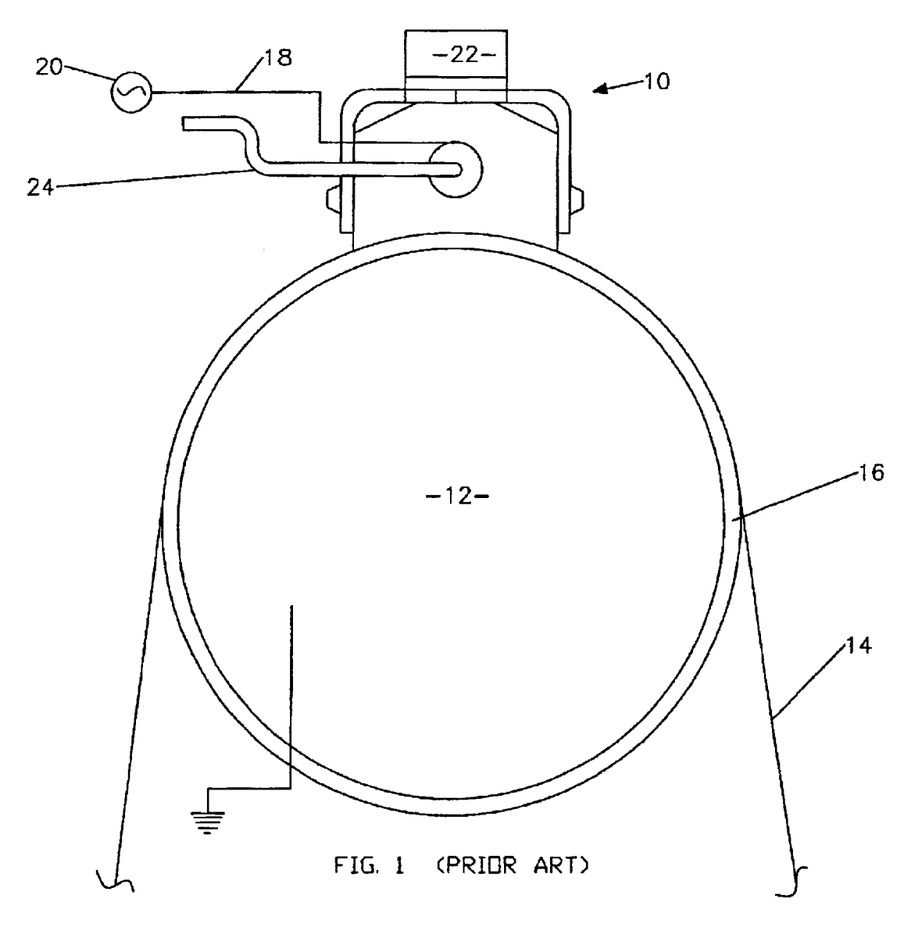
FIG. 1 is a schematic representation of a conventional plasma-treater configuration.

Referring to the drawings, wherein like parts are designated throughout with like numerals and symbols, FIG. 1 shows a general layout of an atmospheric plasma treater assembly according to the invention, wherein a plasma treater 10 is shown mounted opposite to the roller 12 of a conventional web-treatment system. A web or film 14 of material to be treated is passed through the assembly between the plasma treater and the roller at speeds typically ranging from 1 to 200 ft/min. The roller 12 is grounded and coated with a dielectric material 16, such as polyethylene teraphthalate (PET). The plasma treater 10 contains at least one electrode as described in U.S. Pat. No. 6,118,218, such as illustrated schematically in FIG. 2, which is connected, through a cable 18, to an AC power supply 20 operating at any frequency between 60 Hz and the maximum frequency available from the power supply. The treater 10 is held in place conventionally by a holding bracket 22 to maintain a distance of 1–2 mm between the dielectric layer 16 and the treater 10. Plasma gas, such as helium, argon, and mixtures of an inert gas with nitrogen, oxygen, air, carbon dioxide, methane, acetylene, propane, ammonia, or mixtures thereof, can be used with this treater to sustain a uniform and steady plasma at atmospheric pressure. The gas is supplied to the treater 10 through a manifold 24 that feeds the porous electrode of the invention.

Figure 2:
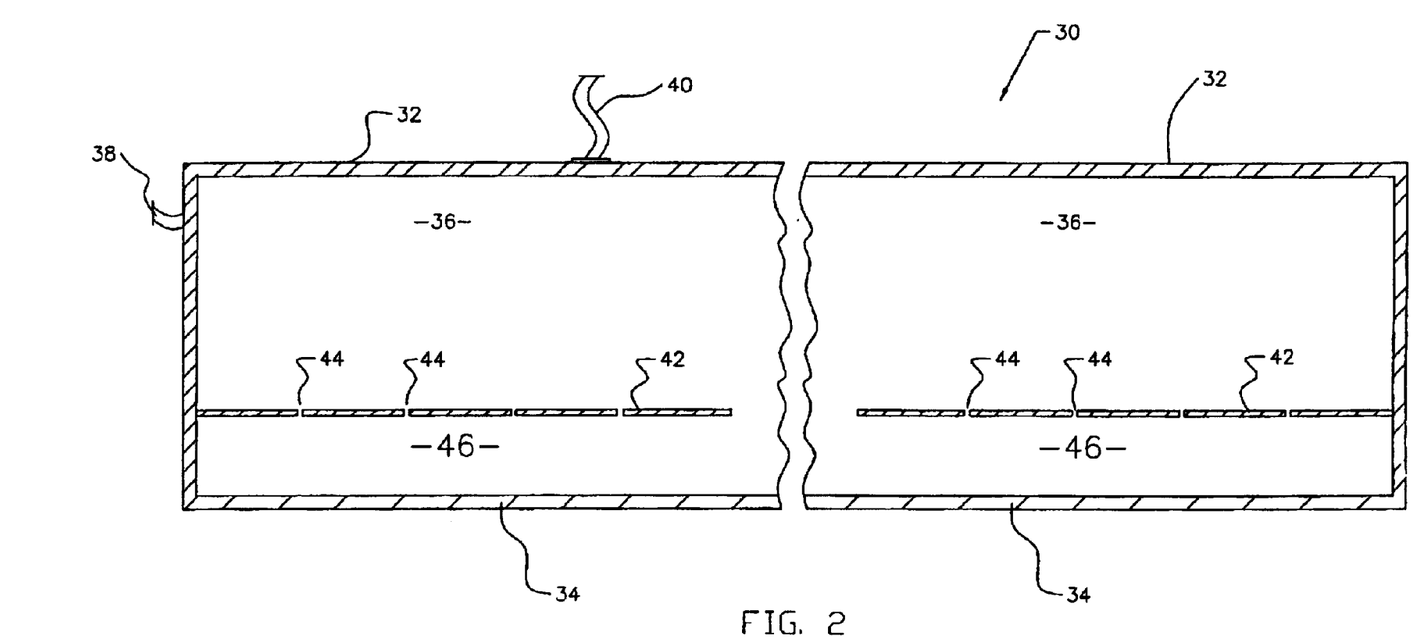
FIG. 2 is a partially cut-out, side sectional view of an electrode containing a porous-metal component according to the invention.

As shown in FIG. 2, an embodiment of a porous electrode 30 incorporated within the treater 10 consists of a hollow housing 32 with a porous metal layer 34 having pores sized to approximate the mean free path of the plasma gas intended to be used in the treater. The gas is fed to the upper portion 36 of the hollow electrode 30 at substantially atmospheric pressure through an inlet pipe 38 connected to the exterior manifold 24. Similarly, the electrode is energized by an electrical wire 40 connected to the power system through the exterior cable 18. The electrode 30 preferably includes a distribution baffle 42 containing multiple, uniformly spaced apertures 44 designed to distribute the gas uniformly throughout the length of the bottom portion 46 of the hollow electrode 30.

In the alternative, any one of several side-by-side embodiments of a porous electrode can be used to practice the invention, as disclosed in U.S. Ser. No. 09/660,003 and exemplified herein in FIG. 3. Such an electrode unit 50 may consist, for example, of a pair of electrodes encased in a dielectric housing 52, such as a ceramic structure. A first, conventional electrode 54 is coupled to a porous electrode 56 made of the same type of porous material described in U.S. Pat. No. 6,118,218. The two electrodes are placed side by side facing the process space 58 where a target substrate is intended to be treated. The electrode assembly 50 is energized by an AC power source 20 and grounded through a ground 60 in conventional manner using either electrode as the ground. An inlet port 62 is connected to the porous electrode 56 to feed the plasma gas to the unit 50 through the porous metal constituting the electrode. The dielectric housing 52 between the porous electrode 56 and the boundary of the process space 58 may also include a dielectric layer 64 that consists of a porous portion capable of diffusing plasma gas received from the porous electrode into the process space. Alternatively, the porous dielectric layer 64 may be used with a hollow electrode 56 (instead of a porous electrode 56) for diffusing the plasma gas into the process space 58.

Figure 3:
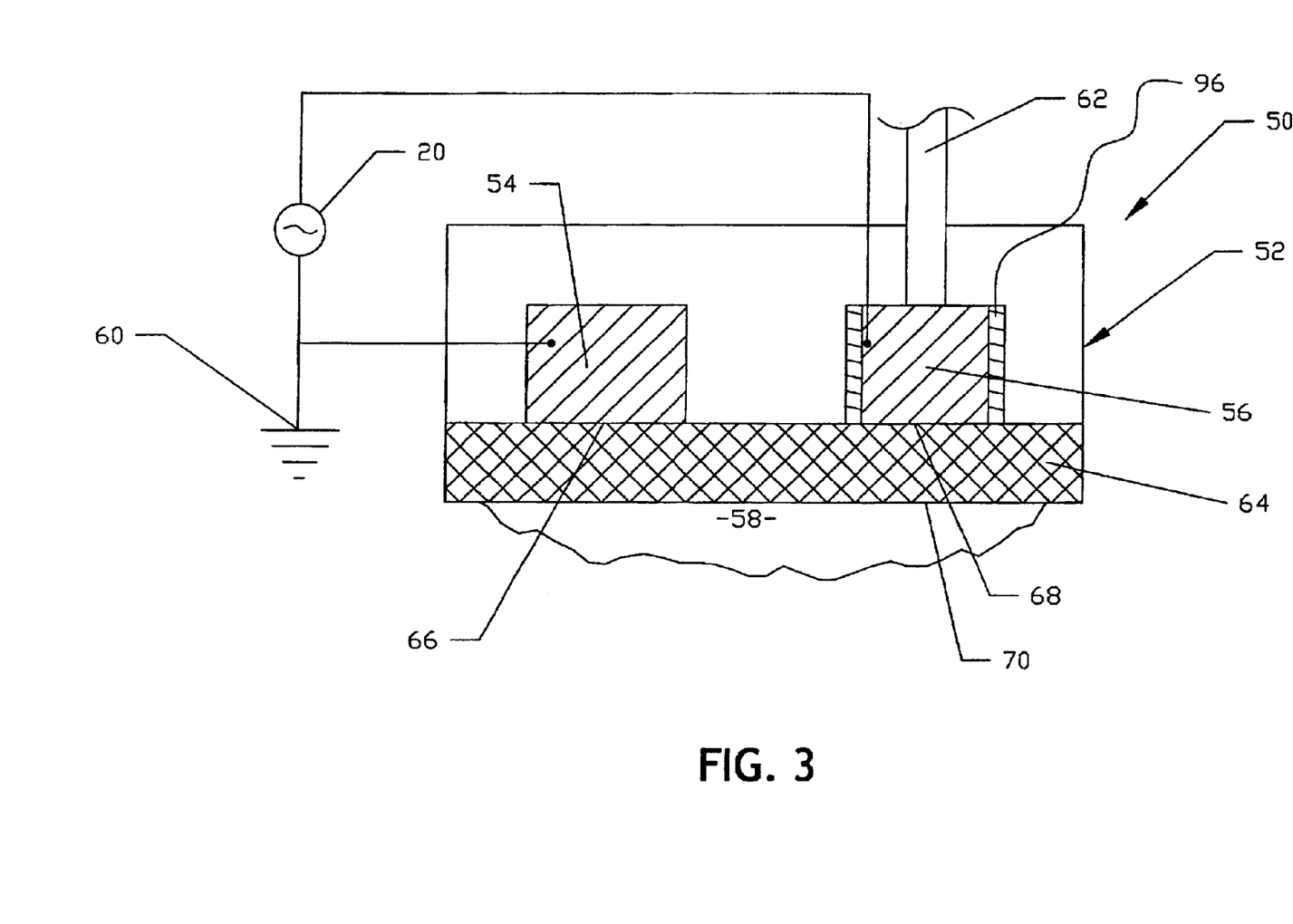
FIG. 3 is a schematic representation of an electrode assembly according to the invention wherein a porous-metal structure is used as an electrode as well as a perfusion medium in side-by-side combination with a conventional electrode encased in a dielectric medium.

As a result of this configuration, an electric field is produced across the process space 58 when the electrode pair 54,56 is energized in conventional manner. The plasma gas is diffused at substantially atmospheric pressure through the porous electrode 56 and the dielectric layer 64 into the process space 58 where the electric field produces a steady-state glow-discharge plasma at power frequencies as low as 60 Hz. For best results, the sides 66 and 68 of the two electrodes facing the process space are substantially aligned with the exposed surface 70 of the porous dielectric layer 64, thereby promoting coupling of the two electrodes and producing an electric field across the process space along a plane aligned with the sides 66,68. Using this side-by-side embodiment of the invention, the treatment space 58 can be expanded without limitations imposed by the need to establish an electric field between the electrode and a grounded roller 12, as was the case prior to the invention disclosed in Ser. No. 09/660,003.

Figure 4:
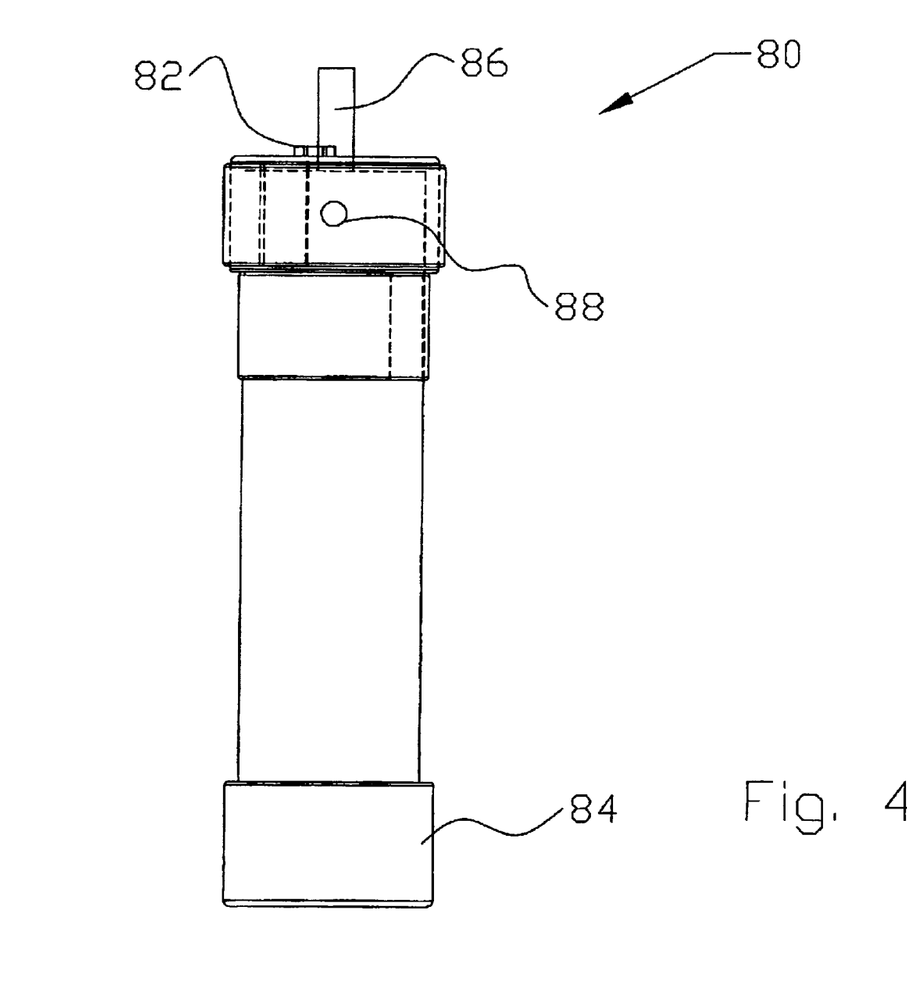
FIG. 4 is a schematic view of an evaporator used to practice the combined vapor-deposition and plasma-treatment processes of the invention at atmospheric pressure.
Figure 5:
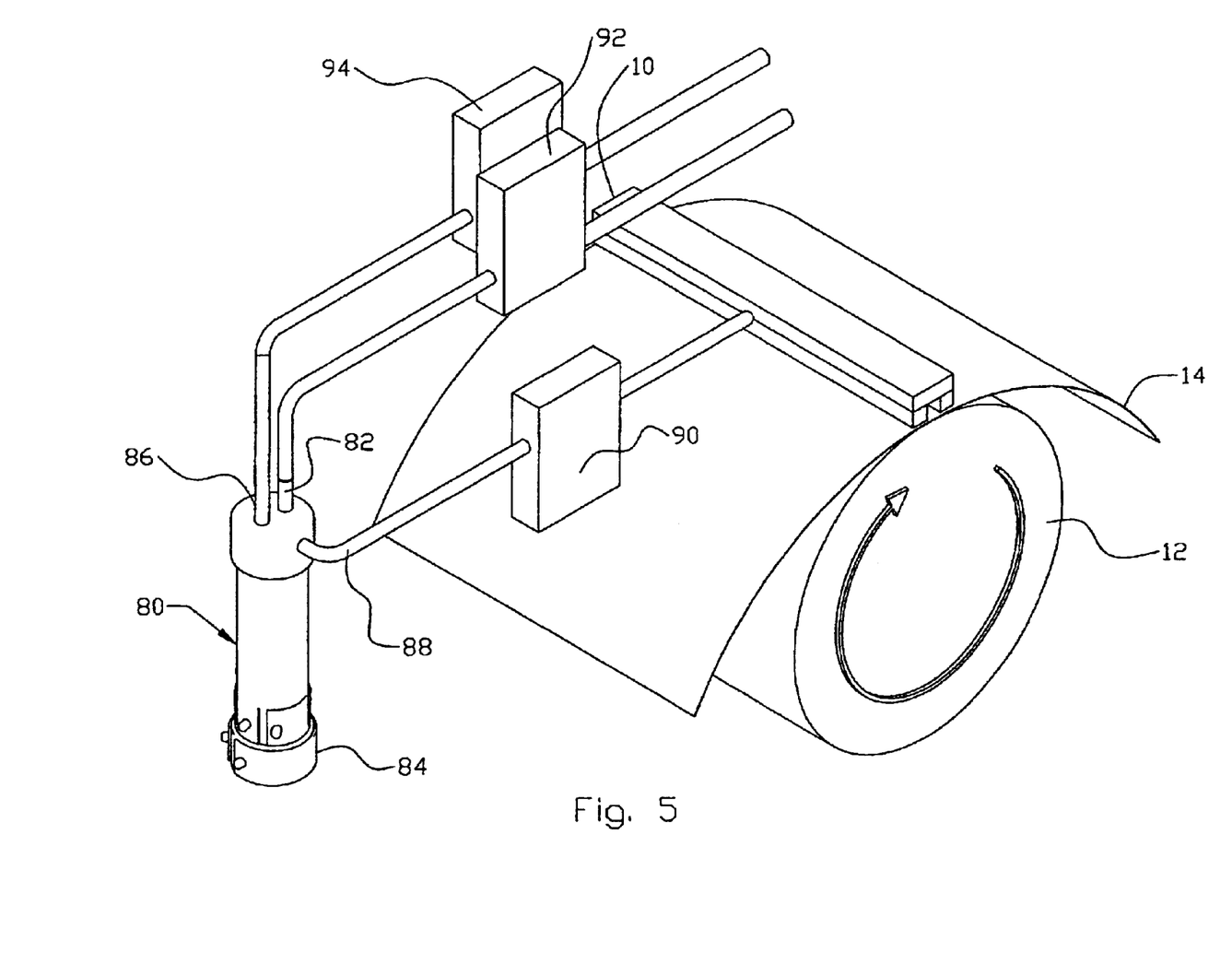
FIG. 5 is a schematic view of the plasma treater configuration of FIG. 1 incorporating the evaporator of FIG. 4 for atmospheric treatment according to the invention by mixing plasma gas and coating precursor prior to injection through the electrode.

In order to practice the present invention, the treater assembly of FIG. 1 is preferably coupled to an evaporator 80, such as illustrated separately in FIG. 4, in order to provide the capability of evaporating liquid and solid precursors. The coating precursor to be deposited by vapor deposition on a given substrate is fed to the evaporator 80 through an inlet port 82 and is heated to its evaporation temperature by heating bands 84 at the bottom of the evaporator. If a gaseous precursor is being used, it passes through the unit without effect (or it may be passed through a bypass channel and injected directly into the plasma area). If a solid precursor is being used, it is liquefied prior to feeding it to the evaporator 80. Plasma gas is also supplied to the evaporator through a separate port 86 and is mixed with the gas or vaporized material prior to being fed to the electrode (30, 50 or equivalent porous electrode) through an outlet duct 88. FIG. 5 shows the combination of the evaporator 80 with a plasma-treatment unit of the type illustrated in FIG. 1, wherein the flow rate of the precursor/plasma-gas mixture to the electrode is controlled by a flowmeter 90 and the flow rates of the precursor and plasma gas into the evaporator 80 are regulated by additional appropriate flowmeters 92 and 94, respectively.

As illustrated schematically with reference to the embodiment 50 of FIG. 3, a heater element 96 may also be used around the porous electrode to maintain the vaporized state of any liquid or solid precursor used in the process while the gas/vapor mixture is diffused through the porous electrode 56 (or equivalent electrode). As would be clear to one skilled in the art, the heater 96 must be capable of maintaining the electrode temperature uniformly above the vaporization temperature of the deposition material at atmospheric pressure. A temperature range from 70° C. to 100° C. has been found to be sufficient for most materials of interest. It is noted that the use of a side-by-side electrode enables plasma treatment without a dielectric coating 16 over the drum 12.

Figure 6:
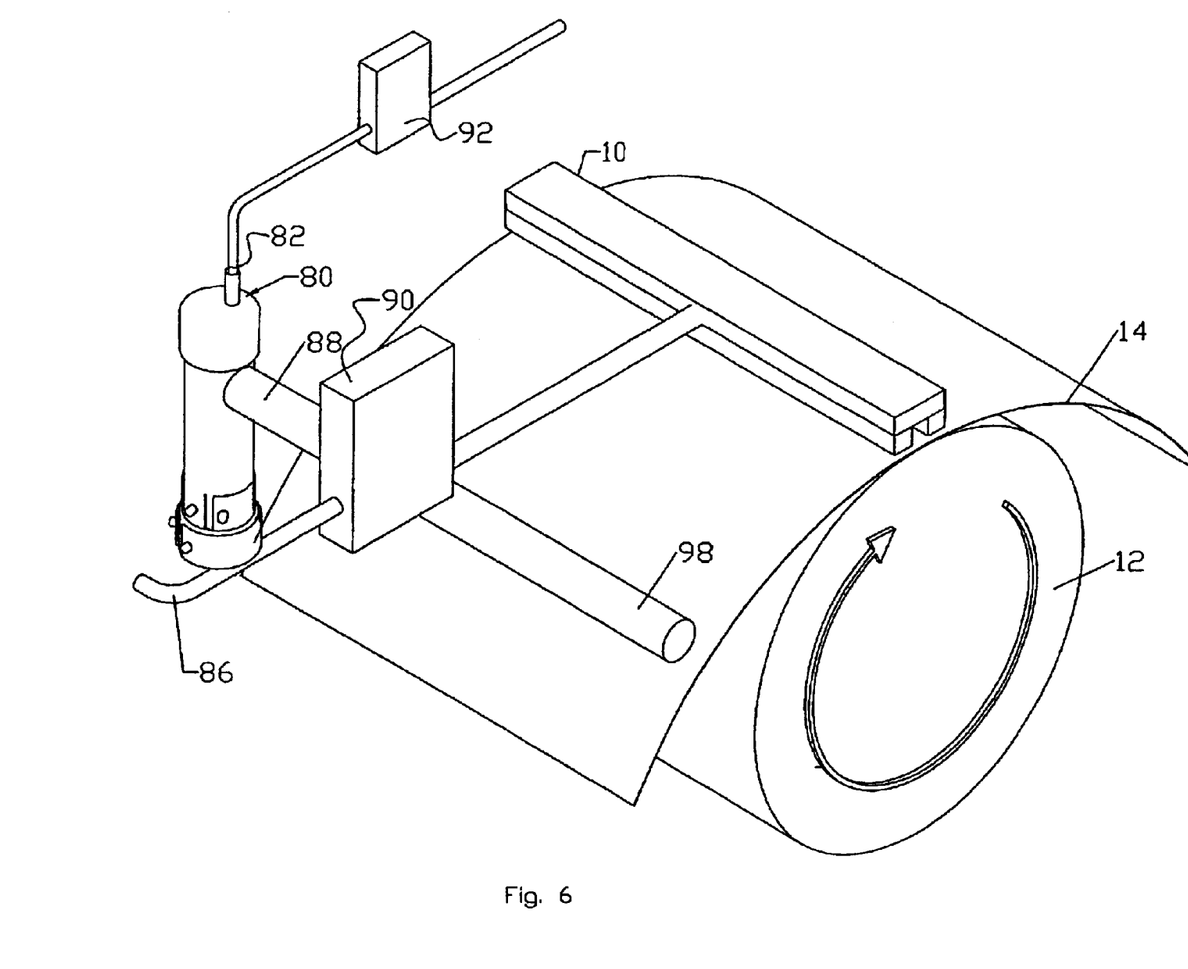
FIG. 6 is a schematic view of the plasma treater configuration of FIG. 5, wherein the coating precursor is injected directly over substrate prior to plasma treatment.

In an alternative embodiment of the invention, the evaporator 80 is used only to evaporate the precursor material, if necessary, separately from the plasma gas. The evaporated material is then injected directly in the vicinity of the plasma field, as illustrated in FIG. 6, prior to passing the substrate through the process space between the plasma treater 10 and the drum 12. The precursor vapor is injected through a slitted nozzle 98 placed across the drum 12, such that the vapor is directed for deposition toward the substrate 14 under the influence of the plasma field created by the treater 10. The plasma gas is injected separately through the porous electrode in the treater 10 to provide the plasma field in the process space.

Organic substrates such as polypropylene, polyethylene, and polyethylene teraphthalate, as well as metal objects, of various thickness were coated according to the invention using various materials with desirable properties for specific objectives. For instance, polyester substrates were coated by vapor deposition in a helium plasma at atmospheric pressure using vaporized silicon-based materials (e.g., siloxanes, alkyl silanes, silazanes, and silsesquioxanes) mixed with the plasma-gas stream and diffused into the treatment area. The resulting products exhibited improved surface properties with regard to moisture- and oxygen-barrier characteristics, hardness, scratch and abrasion resistance, chemical resistance, and low friction. The same plasma gas and fluoro-silicones were also used for vapor deposition under the same conditions by separate injection (through a slitted nozzle) and deposition over the substrate, followed by plasma treatment by passing the substrate through the treater where the plasma gas was diffused separately into the process space. Similarly positive results were obtained with fluorine-based precursors (e.g., fluorocarbons, fluoro-silicones) to provide hydrophobic and/or oleophobic properties. Chlorine-based precursors (e.g., chloro-carbons, chloro-silicones) were used to produce biocide (including antibacterial) and barrier properties; and organo-metallic complex precursors (e.g., silver, copper, boron or aluminum complex) were used to produce electrostatic, dissipative, conductive, biocidal and barrier properties.

The following examples illustrate the process of the invention. All tests reported below are representative of a range of tests carried out with the same materials using a helium plasma gas and a vapor precursor in proportions varying from 10 to 98% by volume plasma gas (about 90% plasma gas being preferred, the balance being vapor precursor). The plasma gas and the vapor precursor were fed to the treater (together or separately, as described above) at a combined rate varying from about 200 to about 500 sccm (standard cubic centimeters per minute). The electrode assembly operated with a porous component with average pore size in the range of 1–20 microns. The substrate material to be treated was passed through the treatment space of a 12-inch plasma treater facing a conventional rotating drum. Some other tests were carried out by placing a target object to be treated in an open space facing the type of electrode illustrated in FIG. 3. Although it has been previously demonstrated that the process can be carried out at frequencies as low as 60 Hz, these tests were conducted at frequencies ranging from about 20 KHz to about 13.5 MHz.

Tow examples are listed for each precursor tested. One example refers to a specific case, while the other reports the range of conditions tested for the same precursor and the corresponding range of results observed. The chemical resistance of the various products was tested as follows: to acids, with hydrochloric and nitric acids:, to bases, with sodium and potassium hydroxide solutions (10% by weight); to organic solvents, with alcohols, ketones, esters, toluene and xylenes.

EXAMPLE 1

Plasma gas: helium fed at 400 sccm
Substrate material: polyester film
Precursor: liquid hexamethyl disiloxane
Evaporator temperature: 75° C.
Mixing step: mixed with plasma gas prior to injection
Feed rate of vaporized precursor: 40 sccm
AC-voltage frequency: 40 KHz
Drum Speed: 18 ft/min
The resulting coated product exhibited the following properties:
moisture-barrier: permeability less than 0.1 gm/m$^2$/day
oxygen-barrier: permeability less than 0.1 cc/m$^2$/day
hardness: 3H on pencil-test scale
chemical resistance: resists organic solvents
friction: coefficient of less than 0.5

EXAMPLE 1A

Plasma gas: helium fed at 300–1000 sccm
Substrate material: polyester film
Precursor: liquid siloxanes
Evaporator temperature: 60–100° C.
Mixing step: mixed with plasma gas prior to injection
Feed rate of vaporized precursor: 20–100 sccm
AC-voltage frequency: 20 KHz to 13.5 MHz
Drum Speed: 5–100 ft/min
The resulting coated product exhibited the following properties:
moisture-barrier: permeability less than 0.1 gm/m$^2$/day
oxygen-barrier: permeability less than 0.1 cc/m$^2$/day
hardness: 3H–4H on pencil-test scale
chemical resistance: resists organic solvents
friction: coefficient of less than 0.5

EXAMPLE 2

Plasma gas: helium fed at 400 sccm
Substrate material: polyester film
Precursor: gaseous trimethyl silane
Evaporator temperature: n/a (25° C.)
Mixing step: mixed with plasma gas prior to injection
Feed rate of precursor: 30 sccm
AC-voltage frequency: 13.5 MHz
Drum Speed: 18 ft/min
The resulting coated product exhibited the following properties:
moisture-barrier: permeability less than 0.01 gm/m$^2$/day
oxygen-barrier: permeability less than 0.01 cc/m$^2$/day
hardness: 5H on pencil-test scale
chemical resistance: resists acids, bases, organic solvents
friction: coefficient of less than 0.5
hydrophobic: contact angle with water greater than 80°

EXAMPLE 2A

Plasma gas: helium fed at 300–1000 sccm
Substrate material: polyester film
Precursor: trialkyl silanes (may be gaseous or liquid)
Evaporator temperature: 25–50° C.
Mixing step: mixed with plasma gas prior to injection
Feed rate of precursor: 20–80 sccm
AC-voltage frequency: 20 KHz to 13.5 MHz
Drum Speed: 5–100 ft/min
The resulting coated product exhibited the following properties:
moisture-barrier: permeability less than 0.01 gm/m$^2$/day
oxygen-barrier: permeability less than 0.01 cc/m$^2$/day
hardness: 3H–5H on pencil-test scale
chemical resistance: resists acids, bases, organic solvents
friction: coefficient of less than 0.5
hydrophobic: contact angle with water $\geq 70°$ to $\geq 100°$

EXAMPLE 3

Plasma gas: helium fed at 400 sccm
Substrate material: copper foil
Precursor: gaseous trimethyl silane
Evaporator temperature: n/a (25° C.)
Mixing step: mixed with plasma gas prior to injection
Feed rate of precursor: 30 sccm
AC-voltage frequency: 13.5 MHz
Drum Speed: 18 ft/min
The resulting coated product exhibited the following properties:
hardness: 4H on pencil-test scale
chemical resistance: resists acids, bases, organic solvents
friction: coefficient of less than 0.5
hydrophobic: contact angle with water greater than 80°

EXAMPLE 3A

Plasma gas: helium fed at 300–1000 sccm
Substrate material: copper foil
Precursor: trialkyl silanes (may be gaseous or liquid)
Evaporator temperature: 25–50° C.
Mixing step: mixed with plasma gas prior to injection
Feed rate of precursor: 20–80 sccm
AC-voltage frequency: 20 KHz to 13.5 MHz
Drum Speed: 5–100 ft/min
The resulting coated product exhibited the following properties:
hardness: 4H–5H on pencil-test scale
chemical resistance: resists acids, bases, organic solvents
friction: coefficient of less than 0.5
hydrophobic: contact angle with water $\geq 70°$ to $\geq 100°$

EXAMPLE 4

Tests were performed under the same conditions of Examples 1 and 1A with silazane precursors on a polyester-film substrate. Similar conditions produced similar results as reported above for those examples.

EXAMPLE 5

Plasma gas: helium fed at 400 sccm
Substrate material: polyester film

Precursor: liquid hexamethyl disiloxane
Evaporator temperature: 75° C.
Mixing step: injected separately into plasma gas
Feed rate of vaporized precursor: 40 sccm
AC-voltage frequency: 40 KHz
Drum Speed: 18 ft/min The resulting coated product exhibited the following properties:
moisture-barrier: permeability less than 1 gm/m$^2$/day
oxygen-barrier: permeability less than 10 cc/m$^2$/day
chemical resistance: not as good as Example 1–24-hour exposure to polar organic solvents deteriorated the coating
friction: coefficient of less than 0.5

EXAMPLE 5A

Plasma gas: helium fed at 300–1000 sccm
Substrate material: polyester film
Precursor: liquid siloxanes
Evaporator temperature: 60–100° C.
Mixing step: injected separately into plasma field
Feed rate of vaporized precursor: 20–100 sccm
AC-voltage frequency: 20 KHz to 13.5 MHz
Drum Speed: 5–100 ft/min The resulting coated product exhibited the following properties:
moisture-barrier: permeability less than 1 gm/m$^2$/day
oxygen-barrier: permeability less than 10 cc/m$^2$/day
chemical resistance: same as in Example 5 above
friction: coefficient of less than 0.5

EXAMPLE 6

Plasma gas: helium fed at 400 sccm
Substrate material: polyester film
Precursor: gaseous trimethyl silane
Evaporator temperature: n/a (25° C.)
Mixing step: injected separately into plasma field
Feed rate of precursor: 30 sccm
AC-voltage frequency: 13.5 MHz
Drum Speed: 18 ft/min The resulting coated product exhibited the following properties:
moisture-barrier: permeability less than 0.01 gm/m$^2$/day
oxygen-barrier: permeability less than 0.01 cc/m$^2$/day
hardness: 5H on pencil-test scale
chemical resistance: resists acids, bases, organic solvents
friction: coefficient of less than 0.5
hydrophobic: contact angle with water greater than 80°

EXAMPLE 6A

Plasma gas: helium fed at 300–1000 sccm
Substrate material: polyester film
Precursor: trialkyl silanes (may be gaseous or liquid)
Evaporator temperature: 25–50° C.
Mixing step: injected separately into plasma field
Feed rate of precursor: 20–80 sccm
AC-voltage frequency: 20 KHz to 13.5 MHz
Drum Speed: 5–100 ft/min The resulting coated product exhibited the following properties:
moisture-barrier: permeability less than 0.1 gm/m$^2$/day
oxygen-barrier: permeability less than 0.1 cc/m$^2$/day
hardness: 3H–5H on pencil-test scale
chemical resistance: resists acids, bases, organic solvents
friction: coefficient of less than 0.5
hydrophobic: contact angle with water $\geq 70°$ to $\geq 100°$

EXAMPLE 7

Plasma gas: helium fed at 400 sccm
Substrate material: polyester film
Precursor: perfluoroisobutylene
Evaporator temperature: 60° C.
Mixing step: mixed with plasma gas prior to injection
Feed rate of vaporized precursor: 60 sccm
AC-voltage frequency: 13.5 MHz
Drum Speed: 18 ft/min The resulting coated product exhibited the following properties:
moisture-barrier: permeability less than 1 gm/m$^2$/day
oxygen-barrier: permeability less than 10 cc/m$^2$/day
hardness: 3H on pencil-test scale
chemical resistance: resists acid, bases, organic solvents
friction: coefficient of less than 0.3
hydrophobic: contact angle with water greater than 100°
oleophobic: contact angle with mineral oil greater than 75°

EXAMPLE 7A

Plasma gas: helium fed at 300–1000 sccm
Substrate material: polyester film
Precursor: liquid fluorocarbons
Evaporator temperature: 60–100° C.
Mixing step: mixed with plasma gas prior to injection
Feed rate of vaporized precursor: 20–100 sccm
AC-voltage frequency: 20 KHz to 13.5 MHz
Drum Speed: 5–100 ft/min The resulting coated product exhibited the following properties:
moisture-barrier: permeability less than 1 gm/m$^2$/day
oxygen-barrier: permeability less than 10 cc/m$^2$/day
chemical resistance: resists acid, bases, and organic solvents
friction: coefficient of less than 0.3
hydrophobic: contact angle with water greater than 100°
oleophobic: contact angle with mineral oil greater,than 75°

EXAMPLE 8

Plasma gas: helium fed at 400 sccm
Substrate material: cotton fabric
Precursor: perfluoroisobutylene
Evaporator temperature: 60° C.
Mixing step: mixed with plasma gas prior to injection
Feed rate of vaporized precursor: 60 sccm
AC-voltage frequency: 13.5 MHz
Drum Speed: 18 ft/min The resulting coated product exhibited the following properties:
chemical resistance: resists acid, bases, organic solvents
biocide/antibacterial: molds did not grow on coated fabric while they grew on uncoated fabric under same conditions

EXAMPLE 8A

Plasma gas: helium fed at 300–1000 sccm
Substrate material: cotton fabric
Precursor: liquid fluorocarbons
Evaporator temperature: 60–100° C.
Mixing step: mixed with plasma gas prior to injection
Feed rate of vaporized precursor: 20–100 sccm
AC-voltage frequency: 20 KHz to 13.5 MHz
Drum Speed: 5–100 ft/min The resulting coated product exhibited the following properties:
chemical resistance: resists acid, bases, organic solvents
biocide/antibacterial: molds did not grow on coated fabric while they grew on uncoated fabric under same conditions

EXAMPLE 9

Tests were performed under the same conditions of Examples 7, 7A, 8 and 8A with fluorocarbon precursors on polyester-film and cotton-fabric substrates, but by injecting the precursor separately into the plasma field instead of first mixing it with the plasma gas. Similar conditions produced similar results as reported above for those examples.

EXAMPLE 10

Plasma gas: helium fed at 400 sccm
Substrate material: polyester film
Precursor: (tridecafluoro-1,1,2,2-tetrahydrooctyl) triethoxysilane
Evaporator temperature: 70° C.
Mixing step: injected separately into plasma field
Feed rate of vaporized precursor: 60 sccm
AC-voltage frequency: 13.5 MHz
Drum Speed: 18 ft/min
The resulting coated product exhibited the following properties:
moisture-barrier: permeability less than 0.1 gm/m$^2$/day
oxygen-barrier: permeability less than 1 cc/m$^2$/day
chemical resistance: resists acid, bases, organic solvents
friction: coefficient of less than 0.2
hydrophobic: contact angle with water greater than 105°

EXAMPLE 10A

Plasma gas: helium fed at 300–1000 sccm
Substrate material: polyester film
Precursor: liquid fluoro-silicones
Evaporator temperature: 60–100° C.
Mixing step: injected separately into plasma field
Feed rate of vaporized precursor: 20–100 sccm
AC-voltage frequency: 20 KHz to 13.5 MHz
Drum Speed: 5–100 ft/min
The resulting coated product exhibited the following properties:
moisture-barrier: permeability less than 0.1 gm/m$^2$/day
oxygen-barrier: permeability less than 1 cc/m$^2$/day
chemical resistance: resists acid, bases, and organic solvents
friction: coefficient of less than 0.2
hydrophobic: contact angle with water greater than 105°

EXAMPLE 11

Tests were performed under the same conditions of Examples 10 and 10A with fluoro-silicone precursors on polyester-film substrates, but by injecting the precursor separately into the plasma field instead of first mixing it with the plasma gas. Similar conditions produced similar results as reported above for those examples.

EXAMPLE 12

Plasma gas: helium fed at 400 sccm
Substrate material: cotton fabric
Precursor: carbon tetrachloride
Evaporator temperature: 70° C.
Mixing step: mixed with plasma gas prior to injection
Feed rate of vaporized precursor: 60 sccm
AC-voltage frequency: 13.5 MHz
Drum Speed: 18 ft/min
The resulting coated product exhibited the following properties:
biocide/antibacterial: molds did not grow on coated fabric while they grew on uncoated fabric under same conditions

EXAMPLE 12A

Plasma gas: helium fed at 300–1000 sccm
Substrate material: cotton fabric
Precursor: chlorocarbons
Evaporator temperature: 60–100° C.
Mixing step: mixed with plasma gas prior to injection
Feed rate of vaporized precursor: 20–100 sccm
AC-voltage frequency: 20 KHz to 13.5 MHz
Drum Speed: 5–100 ft/min
The resulting coated product exhibited the following properties:
biocide/antibacterial: molds did not grow on coated fabric while they grew on uncoated fabric under same conditions

EXAMPLE 13

Tests were performed under the same conditions of Examples 12 and 12A with chlorocarbon precursors on nonwoven polypropylene substrates. Similar conditions produced similar results as reported above for those examples.

EXAMPLE 14

Tests were performed under the same conditions of Examples 12, 12A and 13 with chlorocarbon precursors on cotton-fabric and nonwoven polypropylene substrates, but by injecting the precursor separately into the plasma field instead of first mixing it with the plasma gas. Similar conditions produced similar results as reported above for those examples.

EXAMPLE 15

Plasma gas: helium fed at 400 sccm
Substrate material: glass plate
Precursor: silver(I) trifluoroacetylacetonate
Evaporator temperature: 150° C.
Mixing step: mixed with plasma gas prior to injection
Feed rate of vaporized precursor: 20 sccm
AC-voltage frequency: 13.5 MHz
Drum Speed: 18 ft/min
The resulting coated product exhibited the following properties:
electrostatic-dissipative/conductive: surface resistance of 2 Kilo-ohm/square—surface became semi-reflective

EXAMPLE 15A

Plasma gas: helium fed at 300–1000 sccm
Substrate material: glass plate
Precursor: organo-silver complexes
Evaporator temperature: 120–200° C.
Mixing step: mixed with plasma gas prior to injection
Feed rate of vaporized precursor: 20–100 sccm
AC-voltage frequency: 20 KHz to 13.5 MHz
Drum Speed: 5–100 ft/min
The resulting coated product exhibited the following properties:
electrostatic-dissipative/conductive: surface resistance of 2 Kilo-ohm/square—surface became semi-reflective

EXAMPLE 16

Plasma gas: helium fed at 400 sccm
Substrate material: polyester film
Precursor: copper(II) trifluoroacetylacetonate
Evaporator temperature: 150° C.
Mixing step: mixed with plasma gas prior to injection
Feed rate of vaporized precursor: 20 sccm
AC-voltage frequency: 13.5 MHz
Drum Speed: 18 ft/min
The resulting coated product exhibited the following properties:

moisture-barrier: slight improvement
biocide/antibacterial: molds did not grow on coated fabric while they grew on uncoated fabric under same conditions
electrostatic-dissipative/conductive: surface resistance of 7 Kilo-ohm/square

EXAMPLE 16A

Plasma gas: helium fed at 300–1000 sccm
Substrate material: polyester film
Precursor: organo-copper complexes
Evaporator temperature: 120–200° C.
Mixing step: mixed with plasma gas prior to injection
Feed rate of vaporized precursor: 20–100 sccm
AC-voltage frequency: 20 KHz to 13.5 MHz
Drum Speed: 5–100 ft/min
The resulting coated product exhibited the following properties:
moisture-barrier: slight improvement
biocide/antibacterial: molds did not grow on coated fabric while they grew on uncoated fabric under same conditions
electrostatic-dissipative/conductive: surface resistance of 7 Kilo-ohm/square

EXAMPLE 17

Plasma gas: helium fed at 400 sccm
Substrate material: polyester film
Precursor: aluminum(III) trifluoroacetylacetonate
Evaporator temperature: 150° C.
Mixing step: mixed with plasma gas prior to injection
Feed rate of vaporized precursor: 20 sccm
AC-voltage frequency: 13.5 MHZ
Drum Speed: 18 ft/min
The resulting coated product exhibited the following properties:
moisture-barrier: permeability less than 0.1 gm/m$^2$/day
oxygen-barrier: permeability less than 1 cc/m$^2$/day
electrostatic-dissipative/conductive: surface resistance of 500 Ohm/square

EXAMPLE 17A

Plasma gas: helium fed at 300–1000 sccm
Substrate material: polyester film
Precursor: organo-aluminum complexes
Evaporator temperature: 120–200° C.
Mixing step: mixed with plasma gas prior to injection
Feed rate of vaporized precursor: 20–100 sccm
AC-voltage frequency: 20 KHz to 13.5 MHz
Drum Speed: 5–100 ft/min
The resulting coated product exhibited the following properties:
moisture-barrier: permeability less than 0.1 gm/m$^2$/day
oxygen-barrier: permeability less than 1 cc/m$^2$/day
electrostatic-dissipative/conductive: surface resistance of 500 Ohm/square These data show that the invention advantageously enables the production of plasma-enhanced coated substrates at atmospheric-pressure conditions with properties equal to or better than previously obtained under vacuum plasma conditions. These results show that the electrodes of the invention can be used for treating and modifying the surface properties of organic as well as inorganic substrates without vacuum equipment or material-thickness limitations.

Based on their known properties, it is anticipated that a large variety of other polymerizable compounds can be used as precursors with this invention. They include the following:

1. Unsaturated alcohols and esters thereof: allyl, methallyl, 1-choroallyl, 2-chloroallyl, vinyl, methylvinyl, 1-phenalallyl, and butenyl alcohols; and esters of such alcohols with saturated acids such as acetic, propionic, and butyric; with unsaturated acids such as acrylic, α-substituted acrylic (including alkylacrylic, such as methacrylic, ethylacrylic, propylacrylic, etc.; and arylacrylic, such as phenylacrylic), crotonic, oleic, linoeic and linolenic; and with polybasic acids, such as oxalic, and malonic.
2. Unsaturated acids (as listed above for example); and esters thereof with lower saturated alcohols, such as methyl, ethyl propyl, isopropyl, butyl, isobutyl, sec-butyl, tert-butyl, 2-ethylhexyl, and cyclohexyl alcohols; and with saturated lower polyhydric alcohols, such as ethylene glycol, propylene glycol, tetramethylene glycol, neopentyl glycol, and trimethylopropane.
3. Unsaturated lower polyhydric alcohols, such as butenediol; and esters thereof with saturated and unsaturated aliphatic and aromatic, monobasic and polybasic acids, such as illustrated above.
4. Esters of the above-described unsaturated acids, especially acrylic and methacrylic acids, with higher molecular-weight monohydroxy and polyhydroxy materials, such as decyl alcohol, isodecyl alcohol, oleyl alcohol, and stearyl alcohol.
5. Vinyl cyclic compounds including styrene, o-, m-, p-chlorostyrenes, bromostyrenes, fluorostyrens, methylstyrenes, ethylstyrenes, cyanostyrenes; di-, tri-, and tetrachlorostyrenes, bromostyrenes, fluorostyrenes, methylstyrenes, ethylstyrenes, cyanostyrenes, vinylnaphthalene, vinylcyclohexane, divinylbenzene, trivinylbenzene; allybenzene, and heterocycles such as vinylfuran, vinnylpridine, vinylbenzofuran, N-vinylcarbazole, N-vinylpyrrolidone, and N-vinyloxazolidone.
6. Unsaturated ethers, such as methyl vinyl ether, ethyl vinyl ether, cyclohexyl vinyl ether, octyl vinyl ether, diallyl ether, ethyl methallyl ether, and allyl ethyl ether.
7. Unsaturated ketones, such as methyl vinyl ketone and ethyl vinyl ketone.
8. Unsaturated amides, such as acrylamide, methacrylamide, N-methylacrylamide, N-phenylolacrylamide, N-allylacrylamide, N-methylolacrylamide, N-allylcaprolactam, diacetone acrylamide, and 2-acrylamido-2-methylpropanesulfonic acid.
9. Unsaturated aliphatic hydrocarbons, such as ethylene, acetylene, propylene, butanes, butadiene, isoprene, and 2-chlorobutadiene.
10. Unsaturated alky halides, such as vinyl fluoride, vinyl chloride, vinyl bromide, nylidene bromide, allyl chloride, and ally bromide.
11. Unsaturated acid anhydrides, such as maleic, citraconic, itaconic, cis-4-cyclohexene-1,2-dicarboxylic, and bicyclo(2.2.1)-5-heptene-2,3-dicarboxylic anhydrides.
12. Unsaturated acid halides, such as cinnamyl acrykyl, methacrylyl, crontonyl, oleyl, and fumaryl chlorides or bromides.
13. Unsaturated nitriles, such as acrylonitriles, methacrylonitrile, and other substituted acrylonitriles.

Various changes in the details, steps and components that have been described may be made by those skilled in the art within the principles and scope of the invention herein illustrated and defined in the appended claims. Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

We claim:

1. A method for manufacturing a coated substrate by a process of vapor deposition and concurrent glow-discharge plasma treatment at substantially atmospheric pressure, comprising the following steps:
   providing a first electrode and a second electrode separated by a dielectric material and facing a process space:
   applying a voltage across the electrodes;
   mixing a vaporized precursor with a plasma gas;
   diffusing the vaporized precursor and plasma gas through a porous material into the process space at substantially atmospheric pressure; and
   depositing the vaporized precursor over said substrate.

2. The method of claim 1, wherein said precursor includes a component selected from the group consisting of siloxanes, silanes, silazanes, fluoro-silicones, fluoro-carbons, chloro-silicones, chloro-carbons, organo-metallic complexes of silver, copper, boron or aluminum, or a mixture thereof.

3. The method of claim 1, wherein said substrate includes a component selected from the group consisting of a plastic material, a metal, a woven fiber fabric, a nonwoven fiber, glass, or a mixture thereof.

4. The method of claim 2, wherein said substrate includes a component selected from the group consisting of a plastic material, a metal, a woven fiber fabric, a nonwoven fiber, glass, or a mixture thereof.

5. A method for manufacturing a coated substrate by a process of vapor deposition and concuzrent glow-discharge plasma treatment at substantially atmospheric pressure, comprising the following steps:
   providing a first electrode and a second electrode separated by a dielectric material and facing a process space:
   applying a voltage across the electrodes;
   diffusing a plasma gas through a porous material into the process space at substantially atmospheric pressure;
   mixing a vapor precursor with the plasma gas in the process space; and
   depositing the vaporized coating material over said substrate.

6. The method of claim 5, wherein said precursor includes a component selected from the group consisting of siloxanes, silanes, silazanes, fluoro-silicones, fluoro-carbons, chloro-silicones, chloro-carbons, organo-metallic complexes of silver, copper, boron or aluminum, or a mixture thereof.

7. The method of claim 5, wherein said substrate includes a component selected from the group consisting of a plastic material, a metal, a woven fiber fabric, a nonwoven fiber fabric, glass, or a mixture thereof.

8. The method of claim 6, wherein said substrate includes a component selected from the group consisting of a plastic material, a metal, a woven fiber fabric, a nonwoven fiber fabric, glass, or a mixture thereof.

9. A method for manufacturing a coated substrate by a process of vapor deposition and concurrent glow-discharge plasma treatment at substantially atmospheric pressure, comprising the following steps:
   providing a first electrode and a second electrode of opposite polarities separated by a dielectric material and facing a process space:
   applying a voltage across the electrodes,
   mixing a vaporized precursor with a plasma gas;
   diffusing the vaporized precursor and plasma gas into the process space at substantially atmospheric pressure; and
   depositing the vaporized precursor over said substrate;
   wherein said first and second electrodes are positioned on a same side of said process space.

10. The method of claim 9, wherein said precursor includes a component selected from the group consisting of siloxanes, silanes, silazanes, fluoro-silicones, fluoro-carbons, chloro-silicones, chloro-carbons, organo-metallic complexes of silver, copper, boron or aluminum, or a mixture thereof.

11. The method of claim 9, wherein said substrate includes a component selected from the group consisting of a plastic material, a metal, a woven fiber fabric, a nonwoven fiber, glass, or a mixture thereof.

12. The method of claim 10, wherein said substrate includes a component selected from the group consisting of a plastic material, a metal, a woven fiber fabric, a nonwoven fiber, glass, or a mixture thereof.

13. A method for manufacturing a coated substrate by a process of vapor deposition and concurrent glow-discharge plasma treatment at substantially atmospheric pressure, comprising the following steps:
   providing a first electrode and a second electrode of opposite polarities separated by a dielectric material and facing a process space:
   applying a voltage across the electrodes;
   diffusing a plasma gas into the process space at substantially atmospheric pressure;
   mixing a vapor precursor with the plasma gas in the process space; and
   depositing the vaporized coating material over said substrate;
   wherein said first and second electrodes are positioned on a same side of said process space.

14. The method of claim 13, wherein said precursor includes a component selected from the group consisting of siloxanes, silanes, silazanes, fluoro-silicones, fluoro-carbons, chloro-silicones, chloro-carbons, organo-metallic complexes of silver, copper, boron or aluminum, or a mixture thereof.

15. The method of claim 13, wherein said substrate includee a component selected from the group consisting of a plastic material, a metal, a woven fiber fabric, a nonwoven fiber fabric, glass, or a mixture thereof.

16. The method of claim 14, wherein said substrate includes a component selected from the group consisting of a plastic material, a metal, a woven fiber fabric, a nonwoven fiber fabric, glass, or a mixture thereof.

* * * * *

UNITED STATES PATENT AND TRADEMARK OFFICE
CERTIFICATE OF CORRECTION

PATENT NO. : 6,774,018 B2
DATED : August 10, 2004
INVENTOR(S) : Michael G. Mikhael et al.

It is certified that error appears in the above-identified patent and that said Letters Patent is hereby corrected as shown below:

Column 15,
Line 38, please change "concuzrent" to -- concurrent --.

Column 16,
Line 55, please change "includee" to -- includes --.

Signed and Sealed this

Fifteenth Day of February, 2005

JON W. DUDAS
*Director of the United States Patent and Trademark Office*